United States Patent
Linderman et al.

(10) Patent No.: US 10,332,713 B2
(45) Date of Patent: Jun. 25, 2019

(54) SENSOR POSITIONING AND INSTALLATION FIXTURE

(71) Applicant: Whisker Labs, Inc., Germantown, MD (US)

(72) Inventors: Ryan Linderman, Oakland, CA (US); Steven M. Lanzisera, Oakland, CA (US)

(73) Assignee: Whisker Labs, Inc., Germantown, MD (US)

( * ) Notice: Subject to any disclaimer, the term of this patent is extended or adjusted under 35 U.S.C. 154(b) by 42 days.

(21) Appl. No.: 15/890,905

(22) Filed: Feb. 7, 2018

(65) Prior Publication Data
US 2018/0226216 A1  Aug. 9, 2018

Related U.S. Application Data

(60) Provisional application No. 62/456,054, filed on Feb. 7, 2017.

(51) Int. Cl.
*G01D 11/30* (2006.01)
*H01H 71/02* (2006.01)

(52) U.S. Cl.
CPC ...... *H01H 71/0264* (2013.01); *H01H 71/025* (2013.01); *H01H 71/0207* (2013.01); *G01D 11/30* (2013.01); *H05K 2203/0195* (2013.01)

(58) Field of Classification Search
CPC .............. H05K 13/04; H05K 13/0447; H05K 13/0482; H05K 2203/0186; H01H 71/0264; H01H 71/0207; H01H 71/025; G01D 11/30

USPC .................................................. 221/131, 132
See application file for complete search history.

(56) References Cited

U.S. PATENT DOCUMENTS

| | | | | |
|---|---|---|---|---|
| 5,133,675 A | * | 7/1992 | Garthwaite | .......... H01R 13/595 439/459 |
| 2003/0031599 A1 | * | 2/2003 | Brown | ............... G01N 33/4875 422/501 |
| 2016/0188763 A1 | | 6/2016 | Beiner | |

FOREIGN PATENT DOCUMENTS

| EP | 2 637 027 A1 | 9/2013 |
|---|---|---|
| WO | 2016/081657 A1 | 5/2016 |

OTHER PUBLICATIONS

International Search Report from corresponding PCT Patent Application No. PCT/US2018/017220, dated Apr. 26, 2018, 12 pages.

* cited by examiner

*Primary Examiner* — Livius Radu Cazan
(74) *Attorney, Agent, or Firm* — Proskauer Rose LLP

(57) ABSTRACT

An apparatus for positioning and attaching one or more sensor devices to a surface of an electrical component is described. The apparatus comprises one or more sensor devices and a stencil fixture that holds at least one of the one or more sensor devices, where the stencil fixture positions the sensor at a location proximate to a surface of the electrical component prior to attaching the sensor to the surface of the electrical component.

5 Claims, 6 Drawing Sheets

SENSOR POSITIONING AND INSTALLATION FIXTURE

RELATED APPLICATIONS

This application claims priority to U.S. Provisional Patent Application No. 62/456,054, filed on Feb. 7, 2017, which is incorporated herein by reference.

TECHNICAL FIELD

This application relates generally fixtures and related processes for the positioning and attachment of non-contact electrical sensors applied to current carrying devices such as circuit breakers.

BACKGROUND

Non-contact electrical sensor assemblies typically require the attachment of one or more sensors on the surface of the circuit breaker in one or more locations. The wide variety of circuit breaker shapes and configurations requires a multi-sensor cable assembly that can be adapted to nearly any breaker geometry, rather than a rigid concept that requires a unique design for every circuit breaker type. Additionally, because the sensors use a pressure sensitive adhesive to adhere to the surface of the breaker, it is challenging to position the sensors close to the surface without accidentally adhering them in a non-ideal position. The adhesive that bonds the sensor to the surface of the breaker loses its bonding strength the more times it is reworked to a new position and the installation process becomes challenging.

SUMMARY

Therefore, what is needed is a flexible, multi-sensor cable apparatus that is configured using a stencil fixture to position each sensor on an electrical component, such as a circuit breaker. The stencil fixture advantageously holds each sensor in place over the corresponding electrical component prior to affixing the sensor to the electrical component, so that the sensors are positioned correctly without having to remove and re-position the sensors.

The invention, in one aspect, features an apparatus for positioning and attaching one or more sensor devices to a surface of an electrical component, the apparatus comprising one or more sensor devices and a stencil fixture that holds at least one of the one or more sensor devices, where the stencil fixture positions the sensor at a location proximate to a surface of the electrical component prior to attaching the sensor to the surface of the electrical component.

The above aspect can include one or more of the following features. In some embodiments, the electrical component is a circuit breaker. In some embodiments, the stencil fixture holds the one or more sensor devices with a defined gap to the surface of the electrical component while the sensor devices are positioned at the location. In some embodiments, the one or more sensor devices are attached to the surface of the electrical component by applying a force to the one or more sensor devices. In some embodiments, the apparatus comprises a sensor cable assembly that electrically couples the one or more sensor devices to a splice circuit. In some embodiments, the splice circuit includes a magnet to fix the sensor cable assembly to a surface of a metallic enclosure. In some embodiments, the metallic enclosure is part of an electrical energy monitoring system. In some embodiments, the splice circuit includes a pressure-sensitive adhesive to fix the sensor cable assembly to a non-ferrous surface.

Other aspects and advantages of the invention will become apparent from the following detailed description, taken in conjunction with the accompanying drawings, illustrating the principles of the invention by way of example only.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the invention.

DETAILED DESCRIPTION

Figure 1:
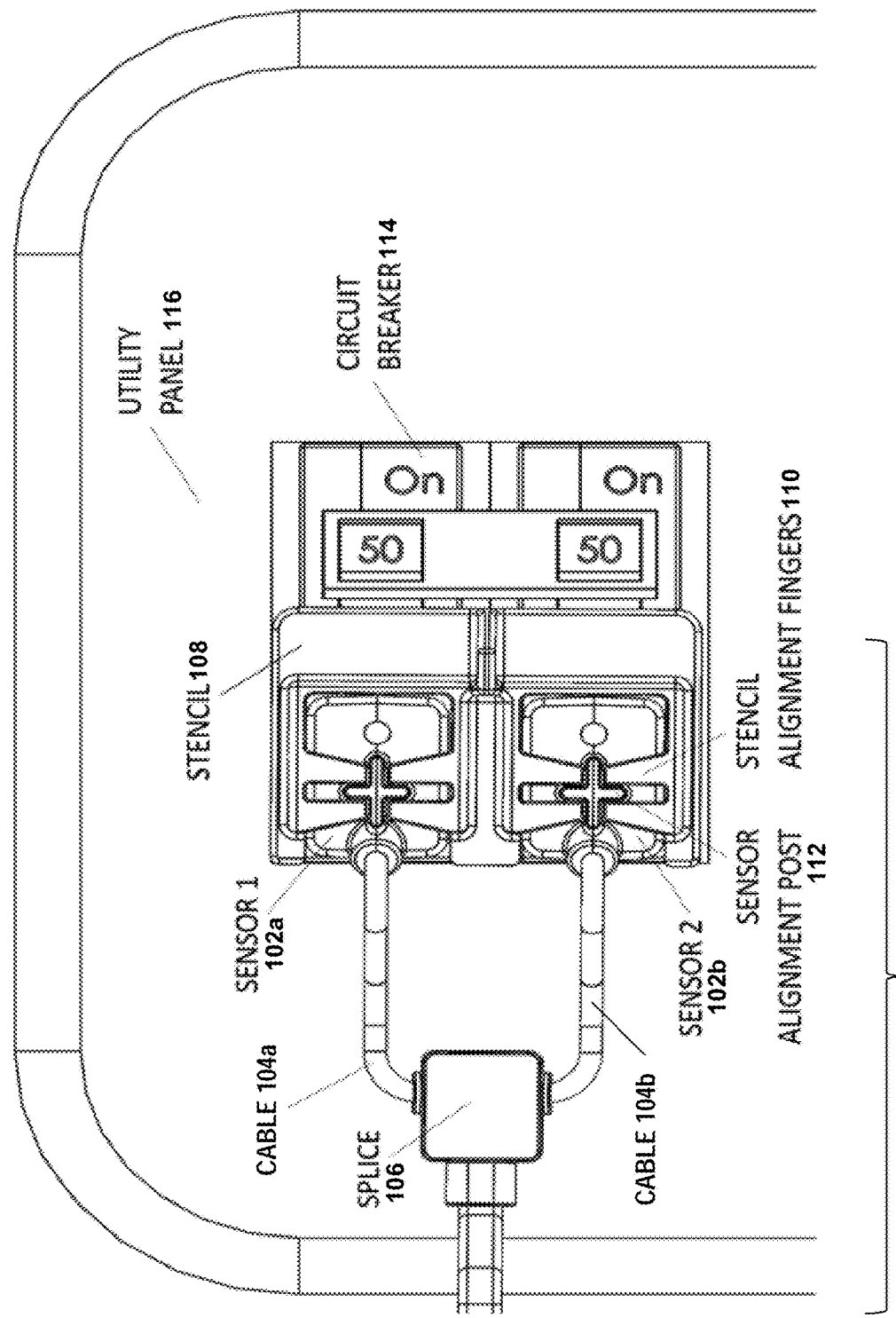
FIG. 1 is a diagram of an exemplary sensor cable assembly comprising a plurality of sensors held in a stencil fixture on a circuit breaker of a utility panel.

FIG. 1 is a diagram of an exemplary sensor cable assembly 101. As shown in FIG. 1, the assembly 101 includes a plurality of sensors 102a, 102b that are coupled respectively via sensor-to-splice cables 104a, 104b to an electrical splice circuit 106. At least one of the sensors 102a, 102b of the assembly 101 is inserted into a positioning stencil fixture 108 that engages with geometric features of circuit breaker 114 at utility panel 116 to hold the sensor(s) 102a, 102b at a specific location during installation of the sensor(s) on the circuit breaker. In order to improve positioning accuracy, the stencil fixture 108 utilizes a system of orthogonal slots and fingers (e.g., fingers 110) that engage with protruding post features 112 on the sensor which also prevents the sensor from being incorrectly loaded into the stencil fixture.

The electrical splice circuit 106 of the apparatus allows multiple sensors 102a, 102b to be wired in parallel. Although FIG. 1 shows two sensors 102a, 102b, it should be appreciated that any number of sensors can be coupled to the electrical splice circuit 106 via a sensor-to-splice cable. In some embodiments, the splice circuit can include a magnetic element (e.g., a base) that facilitates holding the sensor cable assembly 101 to a surface of the utility panel 116. In some embodiments, the splice circuit can include a pressure-sensitive adhesive to fix the sensor cable assembly to, e.g., another surface that is non-ferrous. A sensor-to-splice cable 104a, 104b couples each sensor 102a, 102b to the splice circuit 106 which allows the sensor to be positioned at any location within the radius of the corresponding cable. This beneficially allows the more expensive and complex components (e.g., sensor, cables, splice circuit) of the sensor cable assembly 101 to be universal for all circuit breakers with only the stencil fixture requiring customization for each circuit breaker design.

In one embodiment, each sensor 102a, 102b includes a printed control board assembly (PCBA) that includes a controller chip for controlling the functions of the sensor (e.g., detecting electrical or electromagnetic fields emanating from the circuit breaker). In another embodiment, a single controller chip can instead be positioned in the splice circuit 106, and the single controller chip can connect to the PCBA of multiple sensors (e.g., sensors 102a, 102b) to control the functions of those multiple sensors in parallel—thereby reducing the number of controller chips needed for each assembly 101.

Figure 2:
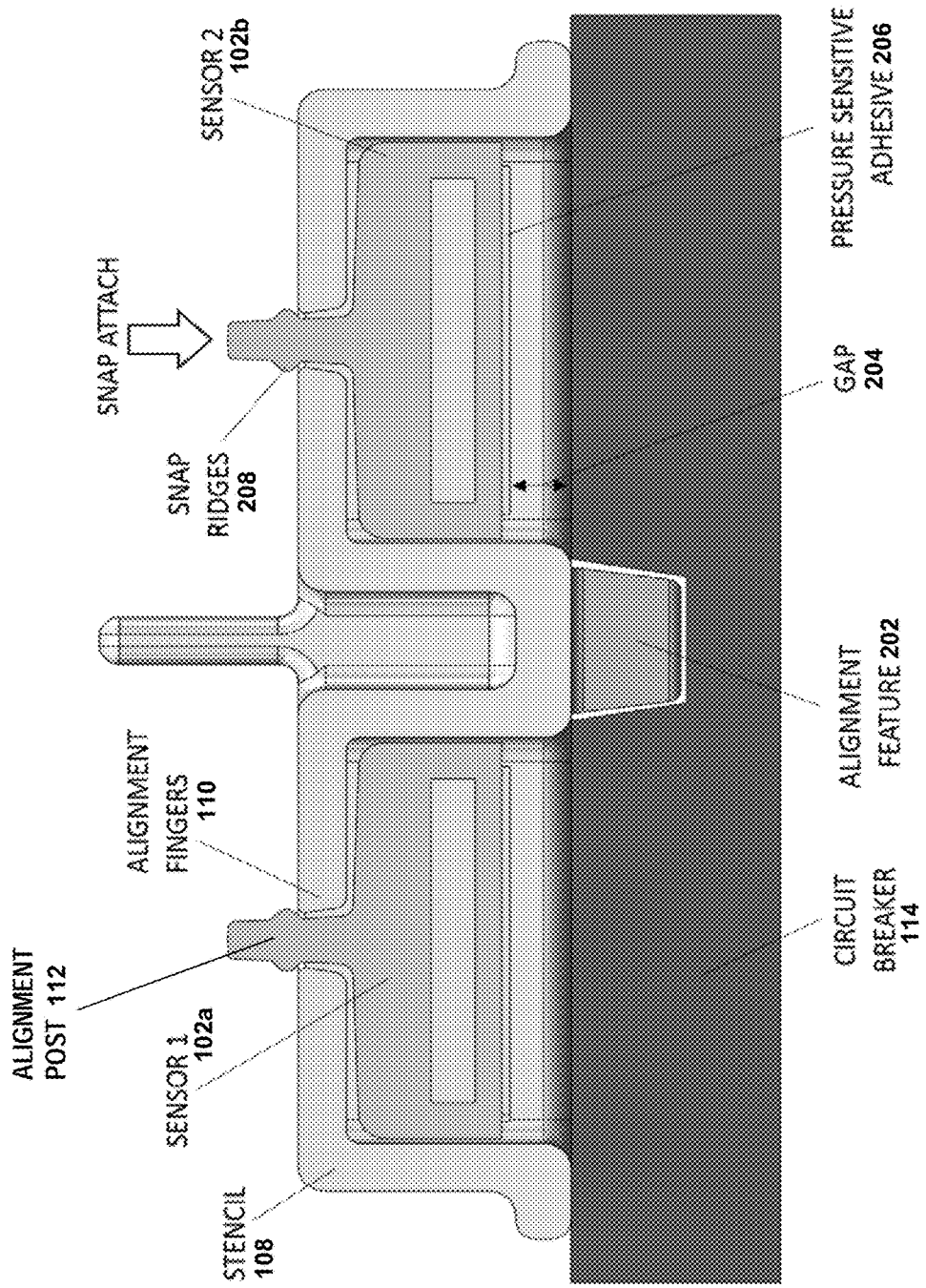
FIG. 2 is a diagram of a cross-section view through the stencil alignment fingers showing features that hold the sensors with a defined gap between an adhesive and the circuit breaker surface.

FIG. 2 is a diagram of a cross-section view through the stencil alignment fingers 110 showing alignment features (e.g., feature 202) of the stencil fixture 108 that hold the sensors 102a, 102b with a defined gap 204 between a pressure-sensitive adhesive 206 on a surface of the sensors and the surface of the circuit breaker 114. It should be appreciated that circuit breakers have varying geometries (e.g., recesses between breakers, around outer corners, etc.) and the fixture 108 and its alignment features can be configured in various ways to engage with the geometry of different types or configurations of breakers.

As shown in FIG. 2, the alignment feature 202 is positioned in a recess on the circuit breaker 114 to enable alignment of the stencil fixture 108 and sensors 102a, 102b with the surface of the breaker(s). The sensor alignment post 112 has snap ridges 208 that engage with the stencil fixture alignment fingers 110 and allow the sensor 102a, 102b to be snapped to a pre-install position slightly above the surface of the circuit breaker 114—as defined by gap 204. With a small applied force to the sensor post 112, the post is snapped down to attach the sensor on the surface of the circuit breaker while maintaining the position of the sensor on the surface of the circuit breaker. When snapped to the lower position, the adhesive 206 contacts the surface of the circuit breaker to fix the position of the sensor and allow the stencil fixture 108 to be removed.

Before installation begins, the sensors 102a, 102b are snapped into their pre-install position within the stencil fixture 108. A protective film is peeled off the pressure-sensitive adhesive 206 to expose the recessed active bonding surface. The stencil fixture 108 can then be held with a single hand, along with the sensors within the fixture, and the fixture can be moved along the surface of the circuit breaker 114 until the stencil alignment features (e.g., feature 202) engage with one or more surface features (e.g., a recess) of the circuit breaker without the adhesive surface being contacted.

Figure 3:
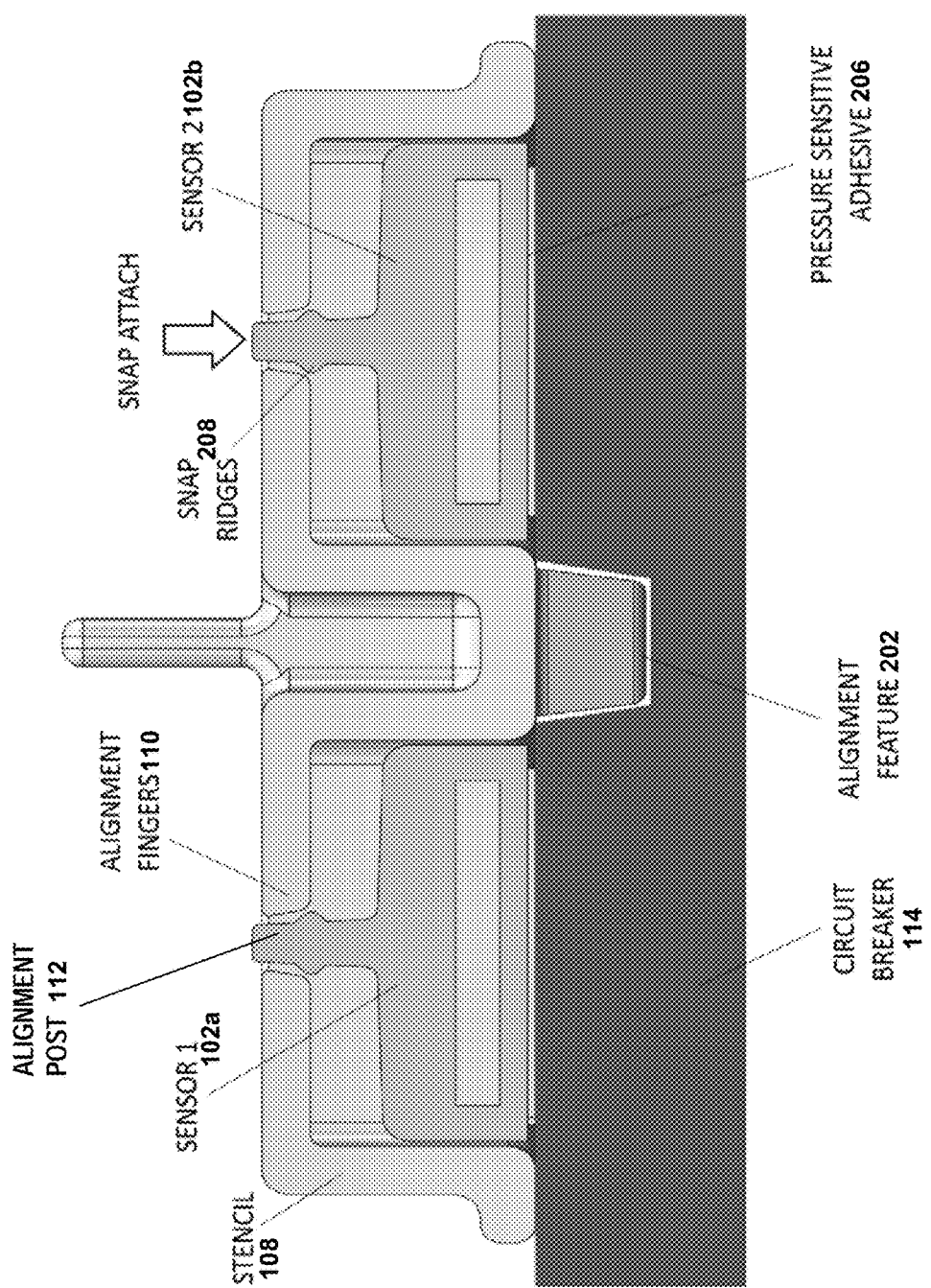
FIG. 3 is a diagram of a cross-section view through the stencil alignment fingers showing the sensors snapped to a lower position and bonded to the circuit breaker surface.

After all sensors are snapped into the lower bonded position, the stencil fixture 108 is lifted off the circuit breaker—leaving the sensors 102a, 102b in their bonded position to complete the installation process. FIG. 3 is a diagram of a cross-section view through the stencil alignment fingers 110 showing the sensors 102a, 102b snapped to a lower position and bonded to the surface of the circuit breaker 114.

Figure 4:
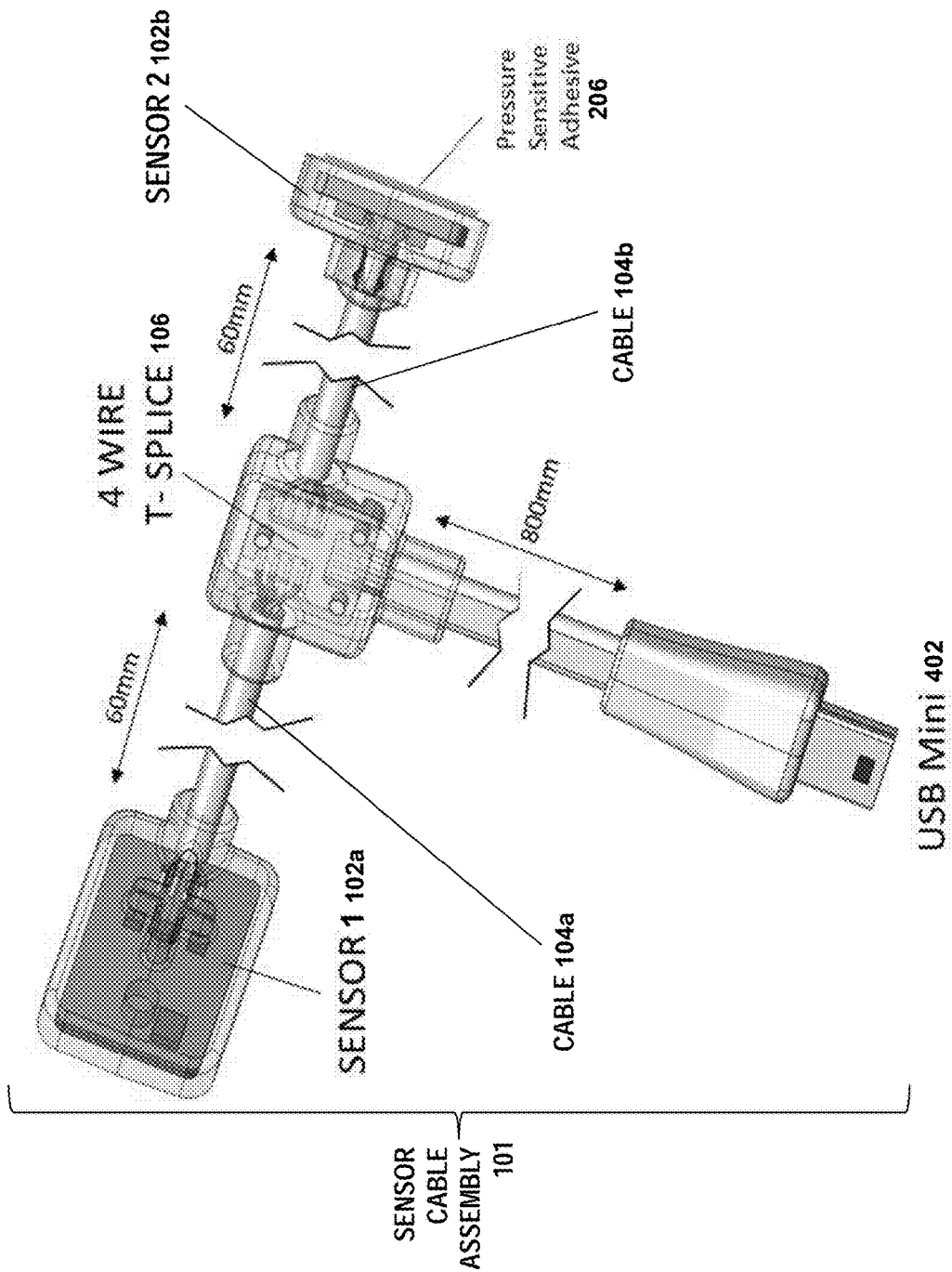
FIG. 4 is a diagram of an exemplary sensor cable assembly with a 4-wire T-splice circuit.

FIG. 4 is a diagram of the exemplary sensor cable assembly 101 of FIG. 1 with a 4-wire T-splice circuit 106. As shown in FIG. 4, the splice circuit 106 is coupled to each sensor 102a, 102b via a sensor-to-splice cable 104a, 104b. The splice circuit 106 is further coupled to a USB Mini cable 402 for, e.g., transmitting data to and receiving data from a communications network and/or remote computing device, as well as providing electrical power to the sensor cable assembly 101.

Figure 5:
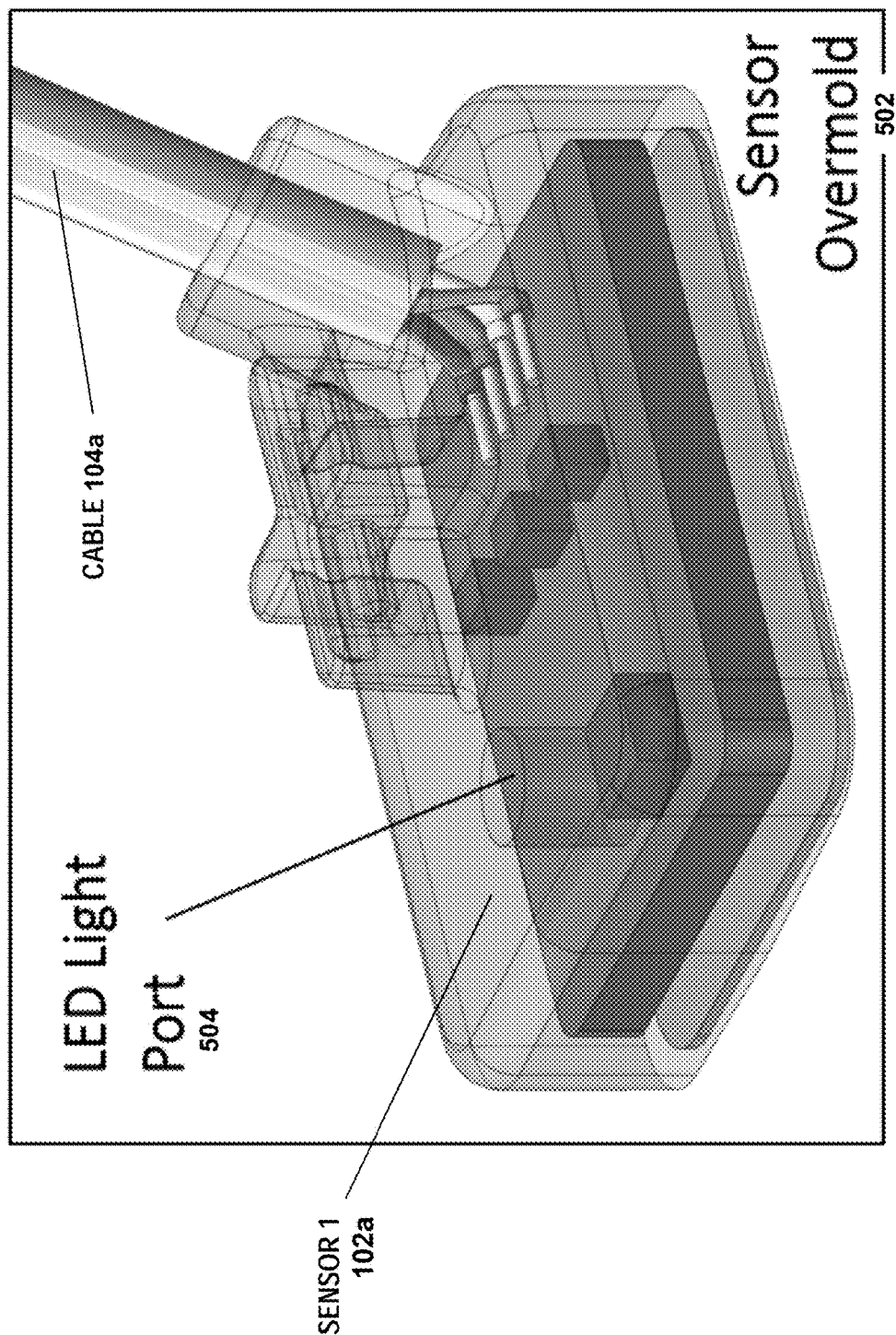
FIG. 5 is a diagram of an exemplary sensor of the sensor cable assembly.

FIG. 5 is a diagram of an exemplary sensor (e.g., sensor 102a) of the sensor cable assembly of FIG. 1. In FIG. 5, the sensor overmold 502 (e.g., a plastic or metallic enclosure surrounding the sensor circuitry and components) is shown as transparent so that the underlying elements of the sensor can be seen. In one embodiment, the sensor 102a includes an LED light 504 which can provide visual feedback to verify the assembly is working during installation to the circuit breakers.

Figure 6:
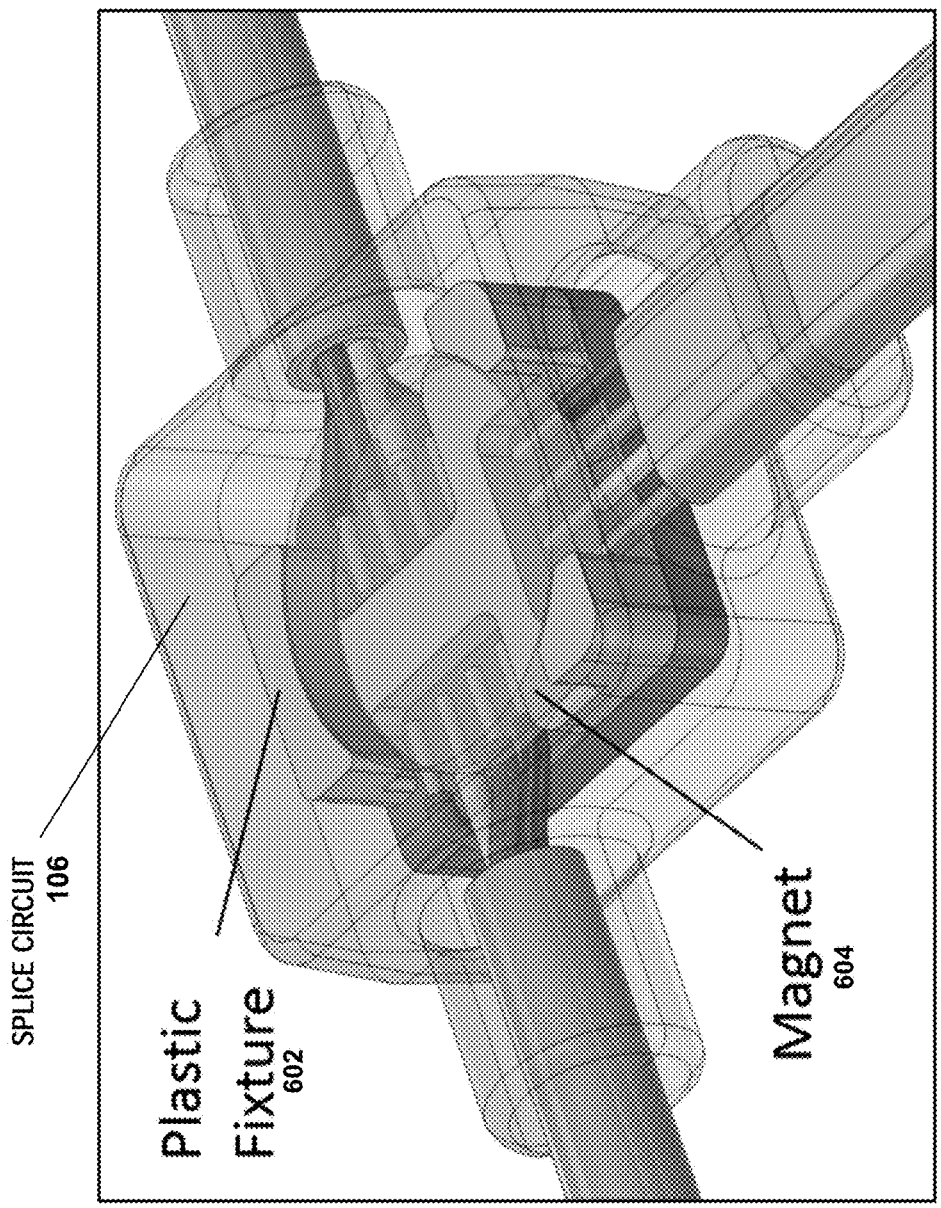
FIG. 6 is a diagram of an exemplary T-splice circuit of the sensor cable assembly.

FIG. 6 is a diagram of an exemplary T-splice circuit 106 of the sensor cable assembly of FIG. 1. As shown in FIG. 6, the splice circuit 106 includes a plastic fixture 602 that is coupled to a magnet 604. As described above, the magnet 604 enables the splice circuit 106 to be affixed to, e.g., the metallic surface of the utility panel 116 to facilitate holding the sensor cable apparatus in place during positioning of the sensors. It should be appreciated that in some embodiments, the splice circuit 106 can include a pressure-sensitive adhesive instead of, or in addition to, the magnet 604 to enable the circuit to be attached to, e.g., non-ferrous surfaces.

Exemplary functionality of the sensors included in the sensor cable assembly presented herein is described in International Patent Application No. PCT/US2015/061426, published as International Publication No. WO 2016/018657 A1, which is incorporated herein by reference.

Comprise, include, and/or plural forms of each are open ended and include the listed parts and can include additional parts that are not listed. And/or is open ended and includes one or more of the listed parts and combinations of the listed parts.

One skilled in the art will realize the technology may be embodied in other specific forms without departing from the spirit or essential characteristics thereof. The foregoing embodiments are therefore to be considered in all respects illustrative rather than limiting of the technology described herein.

What is claimed is:

1. An apparatus for positioning and attaching one or more non-contact electrical sensor devices to a surface of a circuit breaker in an electrical utility panel, the apparatus comprising:
   one or more non-contact electrical sensor devices; and
   a stencil fixture that holds at least one of the one or more non-contact electrical sensor devices, the stencil fixture comprising one or more alignment features,
   wherein the one or more alignment features of the stencil fixture engage with one or more geometric features of the circuit breaker to position the non-contact electrical sensor devices at a location proximate to the surface of the circuit breaker prior to attaching the non-contact electrical sensor devices to the surface of the circuit breaker.

2. The apparatus of claim 1, wherein the stencil fixture holds the one or more non-contact electrical sensor devices with a defined gap to the surface of the circuit breaker while the non-contact electrical sensor devices are positioned at the location.

3. The apparatus of claim 1, further comprising a sensor cable assembly that electrically couples the one or more non-contact electrical sensor devices to a splice circuit.

4. The apparatus of claim 3, wherein the splice circuit includes a magnet to fix the splice circuit to a surface of a metallic enclosure in an electrical energy monitoring system.

5. The apparatus of claim 3, wherein the splice circuit includes a pressure-sensitive adhesive to fix the splice circuit to a non-ferrous surface.

\* \* \* \* \*